(12) United States Patent
Nihei et al.

(10) Patent No.: US 8,533,945 B2
(45) Date of Patent: Sep. 17, 2013

(54) WIRING STRUCTURE AND METHOD OF FORMING THE SAME

(75) Inventors: Mizuhisa Nihei, Kawasaki (JP); Shintaro Sato, Kawasaki (JP); Daiyu Kondo, Kawasaki (JP); Yuji Awano, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 852 days.

(21) Appl. No.: 12/059,205

(22) Filed: Mar. 31, 2008

(65) Prior Publication Data
US 2008/0236875 A1 Oct. 2, 2008

(30) Foreign Application Priority Data
Mar. 29, 2007 (JP) ................. 2007-089011

(51) Int. Cl.
*H01R 43/00* (2006.01)
*H05K 1/09* (2006.01)

(52) U.S. Cl.
USPC .................. 29/868; 29/854; 29/884; 174/257

(58) Field of Classification Search
USPC .............. 29/854, 858, 868, 869, 883, 884
See application file for complete search history.

(56) References Cited

U.S. PATENT DOCUMENTS

| | | | |
|---|---|---|---|
| 6,297,063 B1 * | 10/2001 | Brown et al. | 438/2 |
| 7,109,581 B2 * | 9/2006 | Dangelo et al. | 257/720 |
| 7,417,320 B2 * | 8/2008 | Kawabata et al. | 257/774 |
| 2002/0163079 A1 | 11/2002 | Awano | |
| 2004/0105807 A1 | 6/2004 | Fan et al. | |
| 2005/0189655 A1 | 9/2005 | Furukawa et al. | |
| 2005/0215049 A1 | 9/2005 | Horibe et al. | |
| 2006/0086958 A1 | 4/2006 | Eimori | |
| 2006/0290003 A1 | 12/2006 | Kawabata et al. | |
| 2007/0205450 A1 | 9/2007 | Okita | |
| 2013/0109170 A1 * | 5/2013 | Awano et al. | 438/622 |

FOREIGN PATENT DOCUMENTS

| | | |
|---|---|---|
| CN | 1290763 C | 12/2006 |
| JP | 2006-148063 A | 6/2006 |
| JP | 2006-202942 A | 8/2006 |
| WO | 03/099709 A2 | 12/2003 |
| WO | 2006/043329 A1 | 4/2006 |
| WO | 2006/048845 A3 | 5/2006 |

OTHER PUBLICATIONS

Chinese Office Action dated Mar. 13, 2009, issued in corresponding Chinese Patent Application No. 2008100874113.
Shintaro Sato et al., "Novel approach to fabricating carbon nanotube via interconnects using size-controlled catalyst nanoparticles"; IEEE International Interconnect Technology Conference 2006, pp. 230-232.
Mizuhisa Nihei et al. "Low-resistance Multi-walled Carbon Nanotube Vias with Parallel Channel Conduction of Inner Shells"; IEEE International Interconnect Technology Conference 2005, pp. 234-236.
Wolfgang Hoenlein; New Prospects for Microelectronics: Carbon Nanotubes; Jpn J. Apply. Phys. vol. 41 (2002) pp. 4370-4374.
European Search Report dated Jun. 16, 2009, issued in corresponding European Patent Application No. 08152161.9.

* cited by examiner

*Primary Examiner* — Jayprakash N Gandhi
*Assistant Examiner* — Dion Ferguson
(74) *Attorney, Agent, or Firm* — Westerman, Hattori, Daniels & Adrian, LLP

(57) ABSTRACT

A CNT bundle is formed by growing a plurality of CNTs from opposing surfaces of contact blocks toward mutual opposing surfaces, and by contacting the CNTs so that they intersect to electrically connect with each other. Subsequently, a gap of the electrically connected CNT bundle is filled with a metal material, to thereby form a wiring being a composite state of the CNT bundle and the metal material.

8 Claims, 11 Drawing Sheets

WIRING STRUCTURE AND METHOD OF FORMING THE SAME

CROSS-REFERENCE TO RELATED APPLICATIONS

This application is based upon and claims the benefit of priority from the prior Japanese Patent Application No. 2007-089011, filed on Mar. 29, 2007, the entire contents of which are incorporated herein by reference.

BACKGROUND OF THE INVENTION

1. Field of the Invention

The present invention relates to a wiring structure used in a semiconductor device and the like represented by an LSI, and more particularly, to a wiring structure applying a linear structure using a carbon element as a wiring material which possesses a minuteness, a high electrical conduction characteristic and a high allowable current density characteristic, and a method of forming the same.

2. Description of the Related Art

Recently, an LSI market led by a multi media field such as, in particular, a game machine, a portable terminal and the like tends to expand steadily. Regarding a wiring used in the LSI, the use of a copper (Cu) wiring which is conventionally in wide use is considered to reach limits in terms of resistance or current density in the future.

Accordingly, as an alternative to the copper (Cu) wiring, a linear structure made of a carbon element possessing a low-resistance and a resistance to a high current density is attracting attention. For the linear structure, a so-called carbon nano tube (CNT), a carbon nano fiber (CNF) or the like can be cited, which are attracting attention because of their many appealing physical properties.

Conventionally, some suggestions have been made to use the CNTs for the LSI wiring, and, for example, a research is being actively conducted to apply a CNT bundle to a via connection in a vertical direction (refer to Non-Patent Document 1). However, in the LSI wiring, it is naturally demanded to apply the CNTs not only to the via connection in the vertical direction but also to a wiring in a lateral direction. As a method of forming the CNT bundle as the wiring in the lateral direction, there is reported a technique of forming the CNT bundle in the lateral direction using so-called contact blocks being block-shaped base conductors (refer to Non-Patent Document 2). Catalytic metals necessary for forming the CNTs are formed on side surfaces of the contact blocks, and with the use of a CVD method, the CNT bundle is grown. Accordingly, the CNT bundle can be formed in a vertical direction with respect to the side surfaces of the contact blocks. By selecting the surface on which the CNT bundle is formed, that is, the surface on which the catalytic metal is formed, it is possible to select a growth direction of the CNT bundle.

[Patent Document 1] Japanese Patent Application Laid-Open No. 2006-148063

[Non-Patent Document 1] IEEE International Interconnect Technology Conference 2006, pp. 230.

[Non-Patent Document 2] IEEE International Interconnect Technology Conference 2005, pp. 234.

[Non-Patent Document 3] Jpn. J. Appl. Phys. Vol. 41 (2002) pp. 4370-4374

When forming a wiring in the lateral direction according to a method of Non-Patent Document 2, it is necessary to connect a tip portion side of the CNT bundle to another wiring (or an electrode). Accordingly, for example, the CNT bundle is grown from the contact block, and thereafter, another contact block is formed afterward at the tip portion of the CNT bundle, as proposed in Non-Patent Document 3. However, there is generated a need for forming the contact blocks separately in a plurality of times in a wiring layer of the same hierarchy, which complicates a manufacturing process and increases cost, which is disadvantageous.

Further, Patent Document 1 discloses a method of forming the CNT bundle using a sidewall of an insulating film groove or using a thin partition conductive film, but, in this case, it is impossible to form a three-dimensional wiring network.

Furthermore, although it is indicated that the wiring network is built three-dimensionally using the copper (Cu) wiring as a foundation, there is a difference in an allowable current density between the CNT and the copper (Cu)(CNT: $10^9 A/cm^2$, Cu: $10^6 A/cm^2$), so that the combination of the CNT and the copper (Cu) may occur a wire breakage of the copper (Cu) wiring due to an electromigration. Further, the copper (Cu) is hard to be processed by a dry etching and the like, and thus the block formation is difficult.

SUMMARY OF THE INVENTION

According to an aspect of an embodiment, there is a wiring structure having: a pair of block-shaped base conductors being placed at a predetermined interval and facing each other; and a wiring electrically coupling the base conductors, in which the wiring is composed of linear structures each made of a carbon element formed vertically from each of opposing surfaces of the respective base conductors, a part of the linear structures intersecting and contacting between the opposing surfaces to electrically connect with each other.

According to another aspect of an embodiment, there is a method of forming a wiring structure having: forming a pair of block-shaped base conductors so that they are placed at a predetermined interval and facing each other; and forming a wiring by growing linear structures each made of a carbon element vertically from each of opposing surfaces of the respective base conductors so that a part of the linear structures intersects and contacts between the opposing surfaces to electrically couple with each other.

BRIEF DESCRIPTION OF THE DRAWINGS

FIGS. 2-1A to 2-1E are schematic sectional views showing a method of forming a wiring structure according to a first embodiment in order of step;

FIGS. 2-2A to 2-2C are schematic sectional views showing the method of forming the wiring structure according to the first embodiment in order of step following FIGS. 2-1A to 2-1E;

FIGS. 3-1A to 3-1E are schematic sectional views showing a method of forming a wiring structure according to a modified example of the first embodiment in order of step;

FIGS. 3-2A to 3-2C are schematic sectional views showing the method of forming the wiring structure according to the modified example of the first embodiment in order of step following FIGS. 3-1A to 3-1E;

DETAILED DESCRIPTION OF THE PREFERRED EMBODIMENTS

-Basic Gist of Present Invention-

Figure 1A:
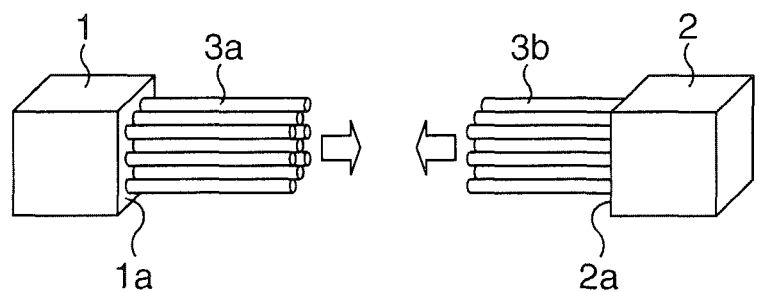
FIGS. 1A to 1C are schematic diagrams for explaining a basic structure of the present invention.

The present invention proposes a wiring structure in which a pair of block-shaped base conductors (contact blocks) is formed so that they are placed at a predetermined interval and facing each other, and each of linear structures is grown vertically from each of opposing surfaces of the respective base conductors so that a part of the linear structures intersects and contacts between the opposing surfaces to electrically connect with each other, to thereby form wirings which compose the wiring structure.

An example will be explained in detail with reference to FIGS. 1A to 1C.

First, a pair of contact blocks 1 and 2 is formed on a horizontal plane. Under this state, with the use of a CVD method, CNTs, here, CNTs 3a and 3b, both of them being plural in number, are grown from opposing surfaces 1a and 2a of the contact blocks 1 and 2 toward mutual opposing surfaces (indicated by a pair of arrows in the drawing) (FIG. 1A). By appropriately controlling a growth time of the CNTs 3a and 3b, they are contacted so as to intersect to electrically connect with each other, and thereby forming a CNT bundle 3 (FIG. 1B). Note that the CNTs 3a and 3b grown from each of the opposing surfaces 1a and 2a can be respectively one in number, for example, but, here, in order to obtain sufficient electrical connection, a case where both of the CNTs 3a and 3b are plural in number is described as an example. Subsequently, in order to obtain secure electrical connection and further low-resistance between the contact blocks 1 and 2, between the contact blocks 1 and 2 is filled with a metal material 4, so that a gap of the electrically connected CNT bundle 3 is filled with the metal material 4, to thereby form a wiring 5 being a composite state of the CNT bundle 3 and the metal material 4 (FIG. 1C).

The contact blocks are preferable to be made using at least one element selected from the group consisting of titanium (Ti), titanium nitride (TiN), tungsten (W), molybdenum (Mo) and silver (Ag), or using an alloy containing at least one element selected from the group as a material. The blocks can be processed suitably with these materials using a dry etching and the like. The use of silver (Ag) is particularly preferable since it is low-resistance material. Further, the use of titanium (Ti), titanium nitride (TiN), tungsten (W) and molybdenum (Mo) is particularly preferable since they have lower electromigration and an excellent resistance to a current density. Furthermore, the use of molybdenum (Mo) is particularly preferable since it can obtain an electrical low-resistance connection with the CNTs.

The metal material forming the above-described composite state is preferable to be made of at least one element selected from the group consisting of copper (Cu), titanium (Ti), titanium nitride (TiN), tungsten (W), molybdenum (Mo) and silver (Ag), or made of an alloy containing at least one element selected from the group. The use of copper (Cu) and silver (Ag) is particularly preferable since they are low-resistance materials. Further, the use of titanium (Ti), titanium nitride (TiN), tungsten (W) and molybdenum (Mo) is particularly preferable since they have lower electromigration and an excellent resistance to a current density. Furthermore, the use of molybdenum (Mo) is particularly preferable since it can obtain an electrical low-resistance connection with the CNTs.

In the present invention, by making the above-described wiring structure as a basic structure, a layer structure may be formed by arranging a plurality of the above-described wiring structures on a horizontal plane. Further, by stacking a plurality of the layer structures with via portions interposed therebetween electrically connecting upper and lower of the contact blocks, it is possible to build a three-dimensional wiring network structure. In this case, by forming the via portions also by the CNTs, the electrical connection can be attained by the CNTs, which realizes the three-dimensional wiring network structure with low-resistance and high mechanical strength.

-Specific Embodiments Applying the Present Invention-

Hereinafter, specific embodiments applying the present invention will be explained in detail with reference to the drawings. In the present embodiment, a structure of a wiring structure will be specifically explained together with a forming method thereof, for the sake of explanation.

-First Embodiment-

FIGS. 2-1A to 2-1E and FIGS. 2-2A to 2-2C are schematic sectional views showing a method of forming a wiring structure according to a first embodiment in order of step. Note that, for the sake of illustration, the illustrations of a silicon substrate 11 are omitted in FIGS. 2-1B to 2-2C.

Figures 1A, 2:
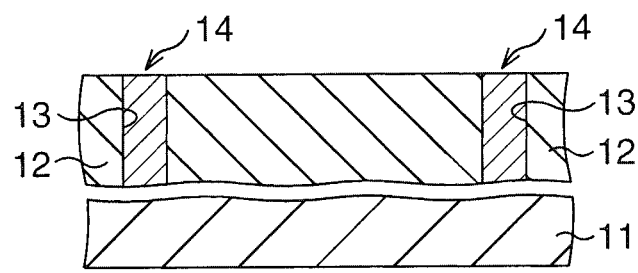
Figures 1B, 2:
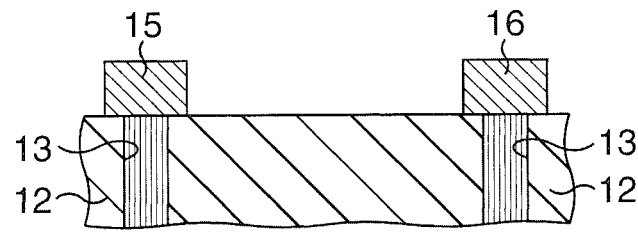
Figures 1C, 2:
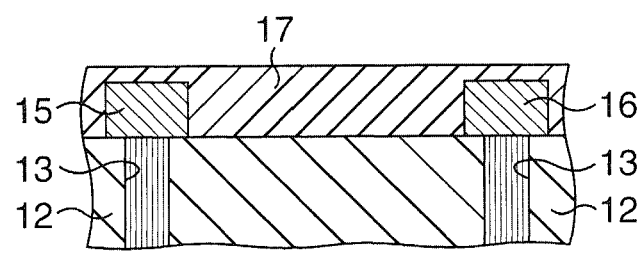

First, an interlayer insulating film 12 and via portions 14 are formed, as shown in FIG. 2-1A.

Specifically, for example, after forming various types of semiconductor elements (MOS transistor or the like: not shown) on the silicon substrate 11, the interlayer insulating film 12 made of a silicon oxide film and the like is formed. After that, in order to obtain an electrical connection with the semiconductor elements, via holes 13 are formed in the interlayer insulating film 12 by a lithography and a dry etching processes. Thereafter, tungsten (W), for example, is deposited on the interlayer insulating film 12 so as to bury the via holes 13 by a CVD method and the like, and the tungsten (W) is polished until a surface of the interlayer insulating film 12 is exposed, using, for instance, a CMP method, to thereby form the via portions 14 filling the via holes 13.

Figure 1B:
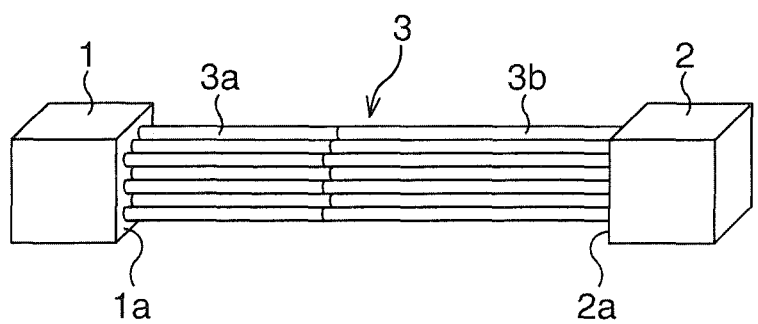

Next, a pair of contact blocks 15 and 16 to be connected to the via portions 14 on the interlayer insulating film 12 is formed, as shown in FIG. 2-1B.

Specifically, a material made of at least one element selected from the group consisting of titanium (Ti), titanium nitride (TiN), tungsten (W), molybdenum (Mo) and silver (Ag), or made of an alloy containing at least one element selected from the group, a titanium nitride (TiN) film, in this case, is deposited to have, for example, about 100 nm in thickness on the surface (made to be substantially flat surface) of the interlayer insulating film 12 on which upper surfaces of the via portions 14 are exposed, using a sputtering method or a vapor deposition method. Thereafter, the titanium nitride (TiN) film is processed by the lithography and the dry etching (or a milling), to thereby form the pair of contact blocks 15 and 16 respectively electrically connected to the via portions 14 on the interlayer insulating film 12. A resist used when processing the titanium nitride (TiN) film is removed by an ashing treatment and the like.

Figure 1C:
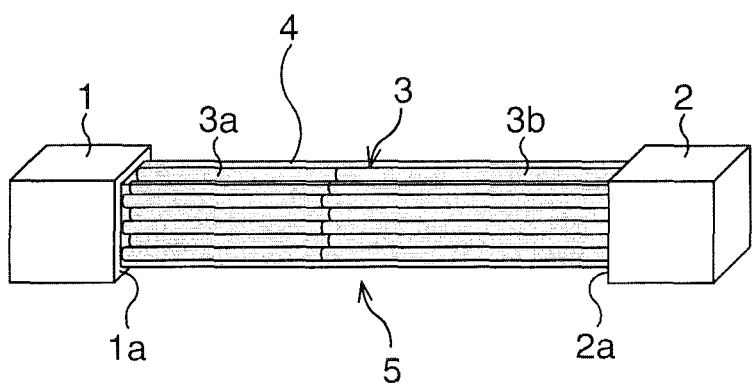

Subsequently, an interlayer insulating film 17 covering the contact blocks 15 and 16 is formed, as shown in FIG. 2-1C.

Specifically, a silicon oxide film or a desired film made of low permittivity material is deposited to have, for example, 200 nm in thickness on the interlayer insulating film 12 so as to cover the contact blocks 15 and 16, using, for instance, the CVD method, to thereby form the interlayer insulating film 17.

Figures 1D, 2:
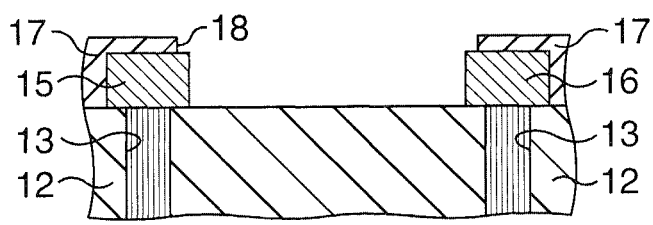

Next, wiring grooves 18 are formed in the interlayer insulating film 17, as shown in FIG. 2-1D.

Specifically, the interlayer insulating film 17 is processed by the lithography and the dry etching to form the wiring grooves 18 in wiring shapes to expose a bottom surface of the interlayer insulating film 12 and each of opposing surfaces 15a and 16a of the contact blocks 15 and 16.

Figures 1E, 2:
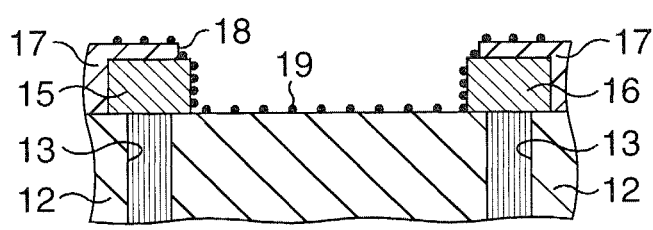

Next, catalysts 19 being growth catalysts for the CNTs are deposited on the whole surface, as shown in FIG. 2-1E.

Specifically, the catalysts 19 made using at least one element selected from the group consisting of iron (Fe), nickel (Ni) and cobalt (Co), or using an alloy of these elements, here, using the cobalt (Co) as a material are deposited on the whole surface including internal surfaces of the wiring grooves 18 using, for example, a laser-ablation method, the sputtering method or the vapor deposition method. In the present embodiment, a case where the catalysts 19 are formed in a state of a large number of fine particles as seen in the drawing, by depositing the catalysts 19 in a state of ultrathin to have, for example, about 1 nm, is described as an example. It is also possible to form the catalysts 19 in a state of thin film, not in a state of fine particles, by varying a deposition condition of the catalysts 19.

Figures 2, 2A:
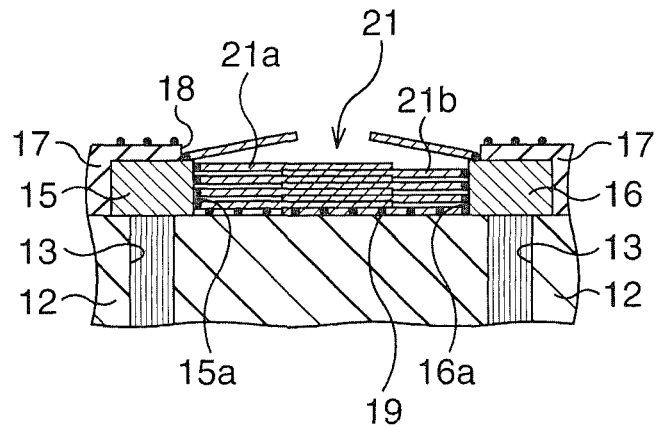

Subsequently, a CNT bundle 21 is grown, as shown in FIG. 2-2A.

Specifically, the CNT bundle 21 is grown in the wiring grooves 18 using the CVD method. The CNT bundle 21 is composed of CNTs 21a and 21b respectively and selectively grown from the catalysts 19 adhered to each of the opposing surfaces 15a and 16a of the contact blocks 15 and 16 exposed in the wiring grooves 18. Here, by using the catalysts 19 adhered to the opposing surfaces 15a and 16a as nuclei, the CNTs 21a and 21b are grown vertically with respect to the opposing surfaces 15a and 16a and toward mutual opposing surfaces, and the CNTs 21a and 21b are contacted so as to intersect to electrically connect with each other, and thereby forming the CNT bundle 21.

As a growth condition of the CNTs 21a and 21b, a thermal CVD method, for example, is applied, in which an acetylene is introduced into a vacuum chamber at a flow rate of 100 sccm as a reactive gas under a pressure of 1 kPa with a substrate temperature of 500° C. A length of the CNTs 21a and 21b can be controlled at a growth rate of about one-tenth of a micron. Further, it is also possible to apply a thermal filament CVD method performing a gas dissociation using a thermal filament. In this case, for example, an acetylene is introduced into a vacuum chamber at a flow rate of 100 sccm as a reactive gas under a pressure of 1 kPa with a substrate temperature of 500° C. and a thermal filament temperature of 1800° C.

Figures 2, 2B:
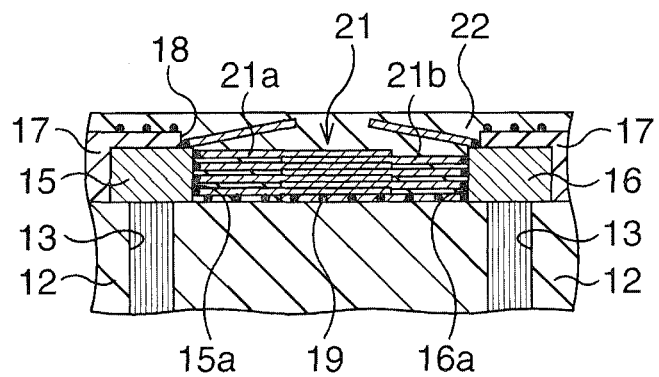

Subsequently, a composite state of the CNT bundle 21 and a metal material 22 is formed, as shown in FIG. 2-2B.

Specifically, in order to obtain a secure electrical connection and a further low-resistance between the contact blocks 15 and 16, the inside of the wiring grooves 18 where the CNT bundle 21 is formed is filled with the metal material 22. For the metal material 22, at least one element selected from the group consisting of copper (Cu), titanium (Ti), titanium nitride (TiN), tungsten (W), molybdenum (Mo) and silver (Ag), or an alloy containing at least one element selected from the group, here, the copper (Cu) is used, and the metal material 22 is deposited to have, for instance, about 300 nm in thickness so as to fill the inside of the wiring grooves 18 using, for example, an electroless plating method. At this time, a gap between the CNTs 21a and 21b of the electrically connected CNT bundle 21 is buried with the metal material 22, so that the CNT bundle 21 and the metal material 22 are made to be the composite state.

Figures 2, 2C:
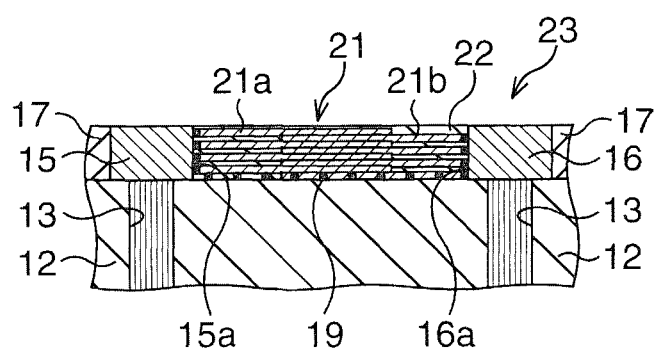

Thereafter, a wiring 23 is formed, as shown in FIG. 2-2C.

Specifically, with the use of a CPM method, the CNTs 21a and 21b, the metal material 22 and respective upper portions of the interlayer insulating film 12 are polished to be flattened until upper surfaces of the contact blocks 15 and 16 are exposed. Accordingly, the wiring grooves 18 are buried with a composite material of the CNT bundle 21 and the metal material 22, to thereby form the wiring 23 in a lateral direction (on a substantially horizontal plane, based on the surface of the interlayer insulating film 12) which electrically connects between the contact blocks 15 and 16.

By performing the above processes, the wiring structure of the present embodiment is completed.

Note that in the present embodiment, a case where the CNTs are formed as the linear structures made of the carbon elements is described as an example, but, fibrous CNFs, for instance, may be formed instead of the CNTs. In this case, similar to the formation of the CNTs, the CNFs are grown to be formed by using the CVD method, the thermal CVD method and the like at a growth temperature lower than that of the CNTs (about 300° C., for example).

According to the present embodiment, it enables to form the wiring 23 made of the composite material composed of the CNT bundle 21 and the metal material 22 using the contact blocks 15 and 16 easily and securely at a low cost by reducing the number of processes as much as possible.

-Modified Example-

Here, a modified example of the first embodiment will be explained. The present example forms a wiring structure similar to the first embodiment, but, it differs from the first embodiment in the formation state of the catalysts for the CNTs. Note that the same reference numerals and symbols are used to designate the same constituent elements explained in the first embodiment.

FIGS. 3-1A to 3-1E and FIGS. 3-2A to 3-2C are schematic sectional views showing a method of forming a wiring structure according to the modified example of the first embodiment in order of step. Note that, for the sake of illustration, the illustrations of the silicon substrate 11 are omitted in FIGS. 3-1B to 3-2C.

Figures 1A, 3:
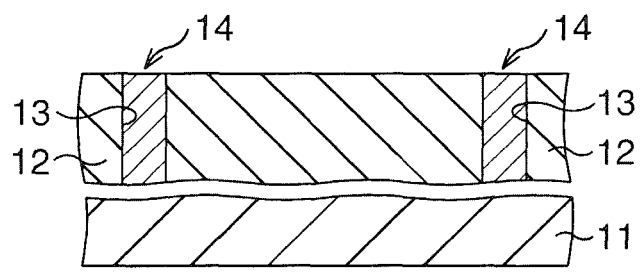
Figures 1B, 3:
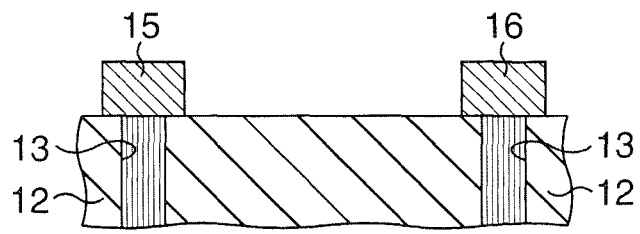
Figures 1C, 3:
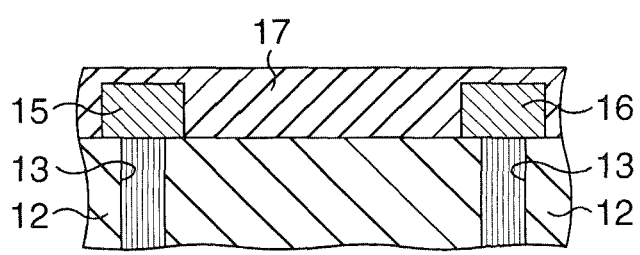
Figures 1D, 3:
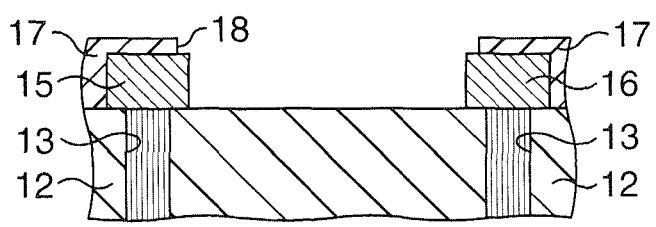
Figures 1E, 3:
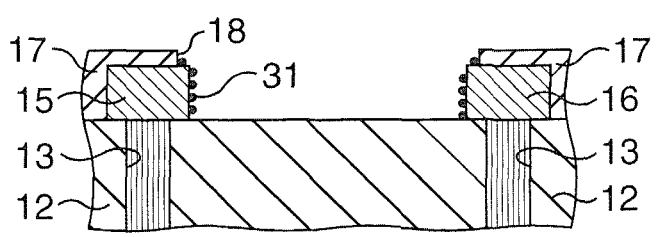
Figures 2A, 3:
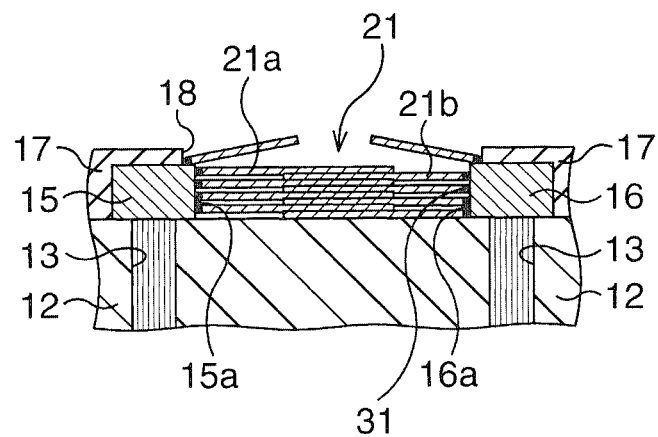
Figures 2B, 3:
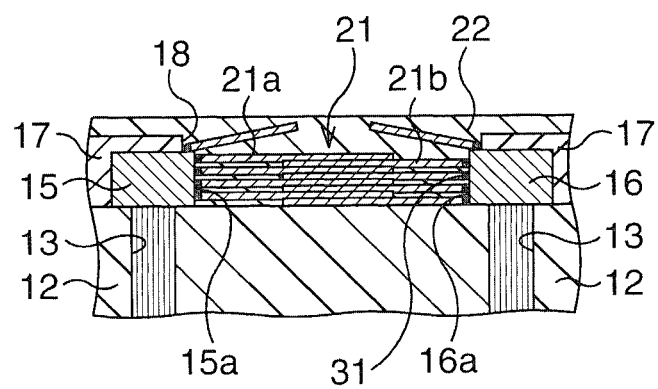
Figures 2C, 3:
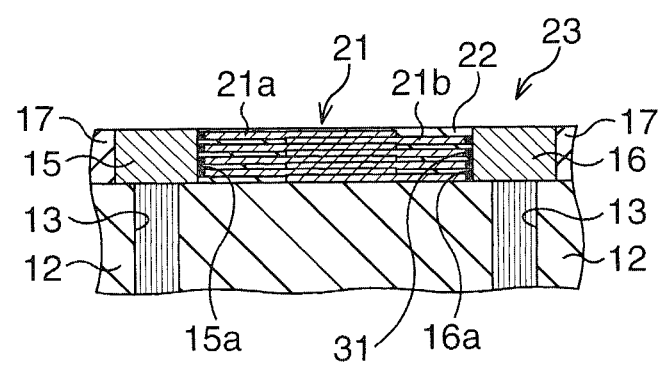

First, processes similar to those of the first embodiment shown in FIGS. 2-1A to 2-1D are conducted, as shown in FIGS. 3-1A to 3-1D.

Subsequently, catalysts 31 to be growth catalysts for the CNTs are selectively deposited only on each of the opposing surfaces 15a and 16a of the contact blocks 15 and 16, as shown in FIG. 3-1E.

Specifically, a nickel-phosphorus (NiP) layer is selectively deposited as the catalysts 31 in an island state (or fine particle state), for example, only on exposed surfaces of the contact blocks 15 and 16, here, the respective opposing surfaces 15a and 16a of the contact blocks 15 and 16 exposed in the wiring grooves 18 using, for instance, a nickel (Ni) electroless plating method. As such, by depositing the catalysts only on the portions necessary for forming the CNTs, the occurrence of metallic contamination and the like due to the deposition of the catalysts on unnecessary portions can be prevented.

Note that the catalysts 31 may be formed in a state of thin film when they are deposited, and they may be made to be in an island state (or fine particle state) when they are heated to a growth temperature of the CNT bundle 21 at a process shown in FIG. 3-2A.

Thereafter, processes similar to those of the first embodiment shown in FIGS. 2-2A to 2-2C are conducted as shown in FIGS. 3-2A to 3-2C, to thereby complete the wiring structure of the present example.

According to the present example, it enables to form the wiring 23 made of the composite material composed of the CNT bundle 21 and the metal material 22 using the contact blocks 15 and 16 easily and securely at a low cost by reducing the number of processes as much as possible, and further by avoiding an adverse impact on the environment.

-Second Embodiment-

Hereinafter, a second embodiment will be explained. The present embodiment forms a wiring structure similar to the first embodiment, but, it differs from the first embodiment in that the wiring structure is built as a three-dimensional wiring network structure. Note that the same reference numerals and symbols are used to designate the same constituent elements explained in the first embodiment.

Figure 4A:
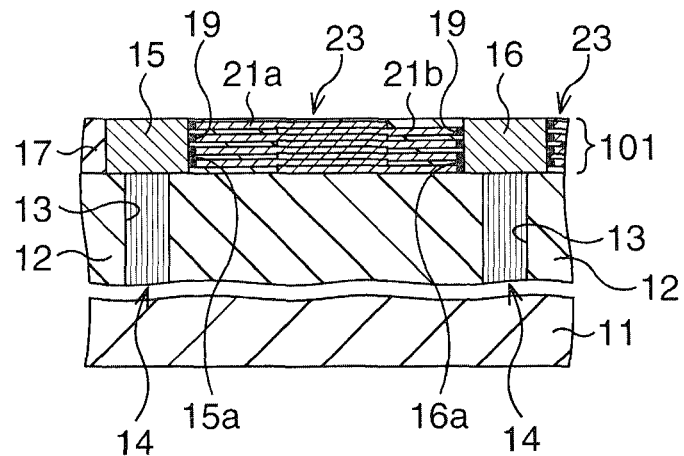
FIGS. 4A to 4C are schematic sectional views showing a method of forming a wiring structure according to a second embodiment in order of step.
Figure 4B:
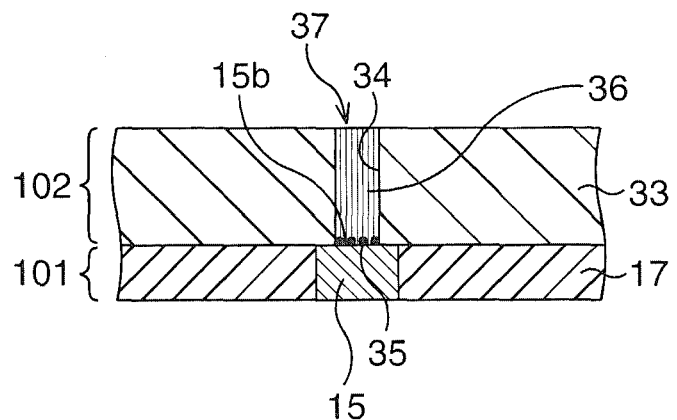
Figure 4C:
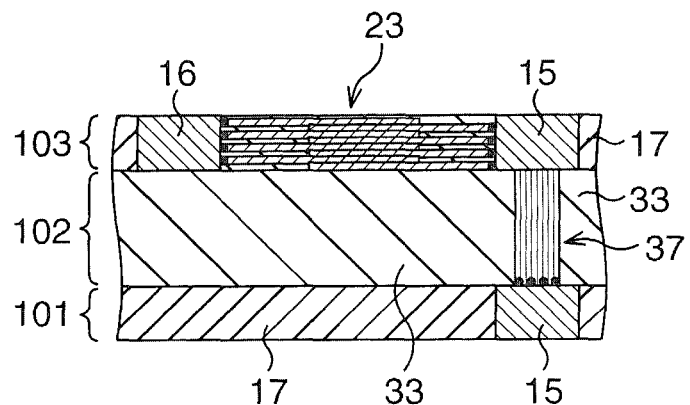
Figure 5:
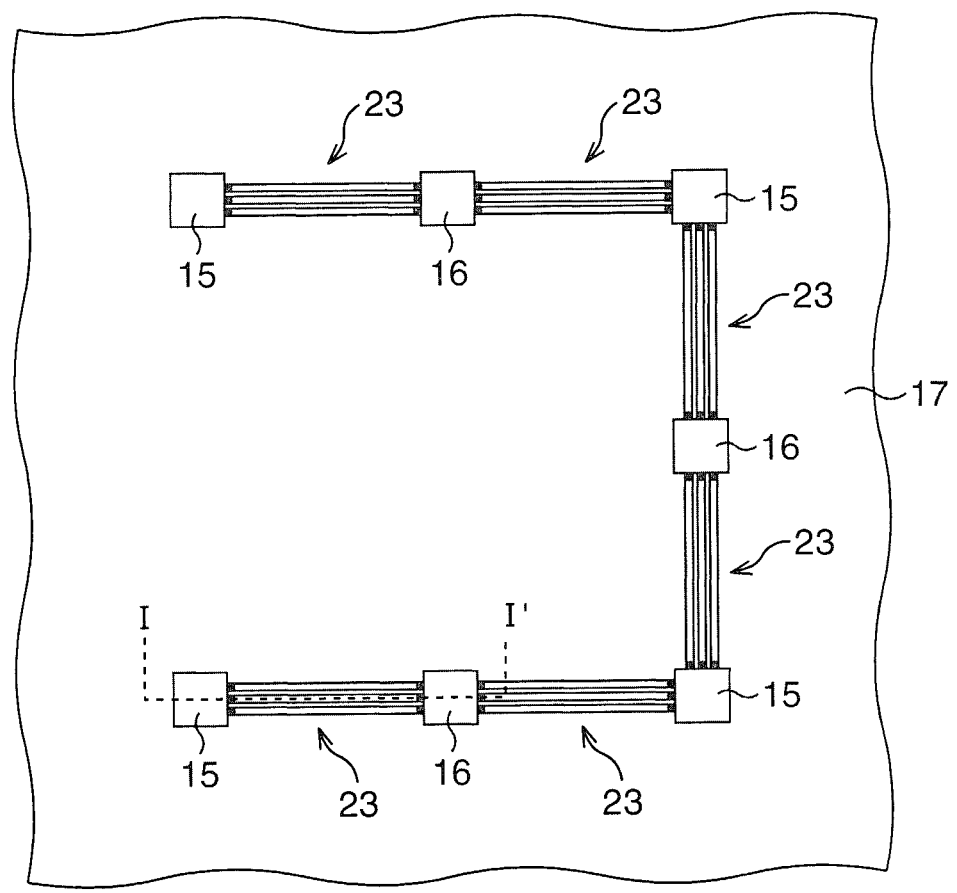
FIG. 5 is a schematic plan view showing the method of forming the wiring structure according to the second embodiment in order of step.
Figure 6:
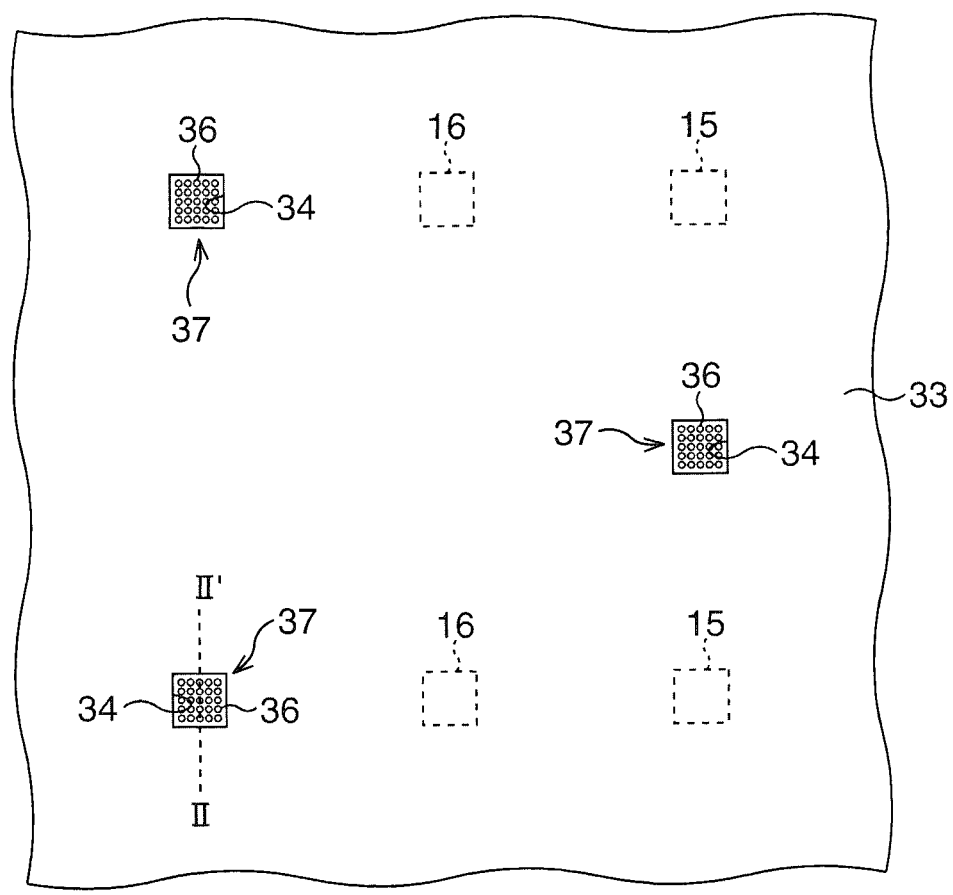
FIG. 6 is a schematic plan view showing the method of forming the wiring structure according to the second embodiment in order of step following FIG. 5.
Figure 7:
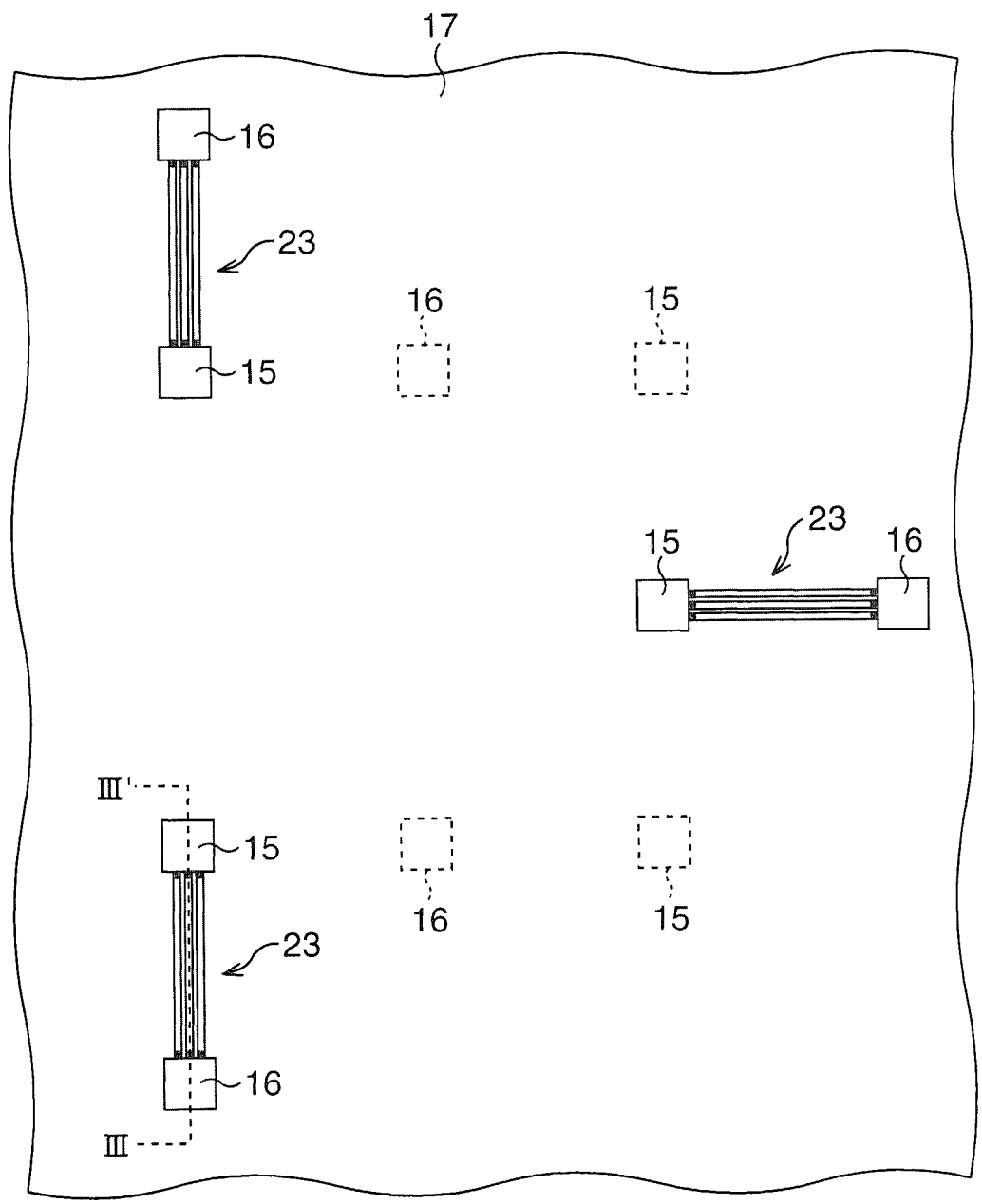
FIG. 7 is a schematic plan view showing the method of forming the wiring structure according to the second embodiment in order of step following FIG. 6.

FIGS. 4A to 4C are schematic sectional views showing a method of forming a wiring structure according to the second embodiment in order of step, FIG. 5 to FIG. 7 are schematic plan views corresponding to FIGS. 4A to 4C, and FIG. 8 is a schematic perspective view showing a completed wiring structure. FIGS. 4A to 4C respectively correspond to cross sections along dotted lines I-I' to III-III' in FIG. 5 to FIG. 7. Note that, for the sake of illustration, the illustration of hierarchical portions of and under an interlayer insulating film 12 is omitted in FIG. 8.

The present embodiment applies the modified example of the first embodiment for forming each of wiring layers composing the three-dimensional wiring network structure. Needless to say, it is also possible to apply the first embodiment.

First, a first wiring layer 101 is formed on the interlayer insulating film 12, as shown in FIG. 4A and FIG. 5.

Specifically, processes similar to the respective processes of the modified example of the first embodiment shown in FIGS. 3-1A to 3-2C are conducted, in which between a plurality of pairs of, here, six pairs of the contact blocks 15 and 16 are electrically connected to be united by the wirings 23 in the interlayer insulating film 17 on the interlayer insulating film 12, and thereby forming the first wiring layer 101.

Note that in the present embodiment, seven via portions 14 are formed in the interlayer insulating film 12 corresponding to the six pairs of contact blocks 15 and 16, as seen in the drawings.

Subsequently, a via layer 102 is formed on the first wiring layer 101, as shown in FIG. 4B and FIG. 6.

Specifically, first, a silicon oxide film or the like is deposited to have, for instance, 300 nm in thickness on the first wiring layer 101 using a CVD method and the like, to thereby form an interlayer insulating film 33.

Next, the interlayer insulating film 33 is processed by a lithography and a dry etching so as to expose upper surfaces of desired contact blocks out of the seven contact blocks composing the six pairs of contact blocks 15 and 16, here, two of the contact blocks 15 and one of the contact block 16, to thereby form via holes 34.

Subsequently, a nickel-phosphorus (NiP) layer is selectively deposited as catalysts 35 only on exposed surfaces of the contact blocks 15 and 16, here, respective upper surfaces 15b and 16b of the contact blocks 15 and 16 exposed at bottom portions of the via holes 34 using, for instance, a nickel (Ni) electroless plating method.

Next, a CNT bundle 36 is grown in the via hole 34 using the CVD method, to thereby form a via portion 37. The CNT bundles 36 are selectively grown from the catalysts 35 adhered to each of the upper surfaces 15b and 16b of the contact blocks 15 and 16 exposed in the via holes 34. Here, by using the catalysts 35 adhered to the upper surfaces 15b and 16b as nuclei, the CNT bundles 36 are grown vertically (upward) with respect to the upper surfaces 15b and 16b.

As a growth condition of the CNT bundle 36, a thermal CVD method, for example, is applied, in which a mixed gas of acetylene and argon is introduced into a vacuum chamber at a flow rate of 0.5 sccm: 1000 sccm as a reactive gas under a pressure of 1 kPa with a substrate temperature of 400° C.

By performing the above processes, the via layer 102 provided with the via portion 37 made by filling inside of the via hole 34 formed in the interlayer insulating film 33 with the CNT bundle 36 is formed.

Thereafter, a second wiring layer 103 is formed on the via layer 102, as shown in FIG. 4C and FIG. 7.

Specifically, processes similar to the respective processes of the modified example of the first embodiment shown in FIGS. 3-1B to 3-2C are performed. In this case, each of the contact blocks 15 and the contact block 16 corresponding thereto are formed on three of the via holes 34 where upper portions of the CNT bundles 36 are exposed, and the wirings 23 are respectively formed between each of the contact blocks 15 and 16 on the via layer 102, similar to the modified example of the first embodiment. Accordingly, between a plurality of pairs of, here, three pairs of the contact blocks 15 and 16 are electrically connected to be united by the wirings 23 in the interlayer insulating film 17 on the interlayer insulating film 33, and thereby forming the second wiring layer 103.

Figure 8:
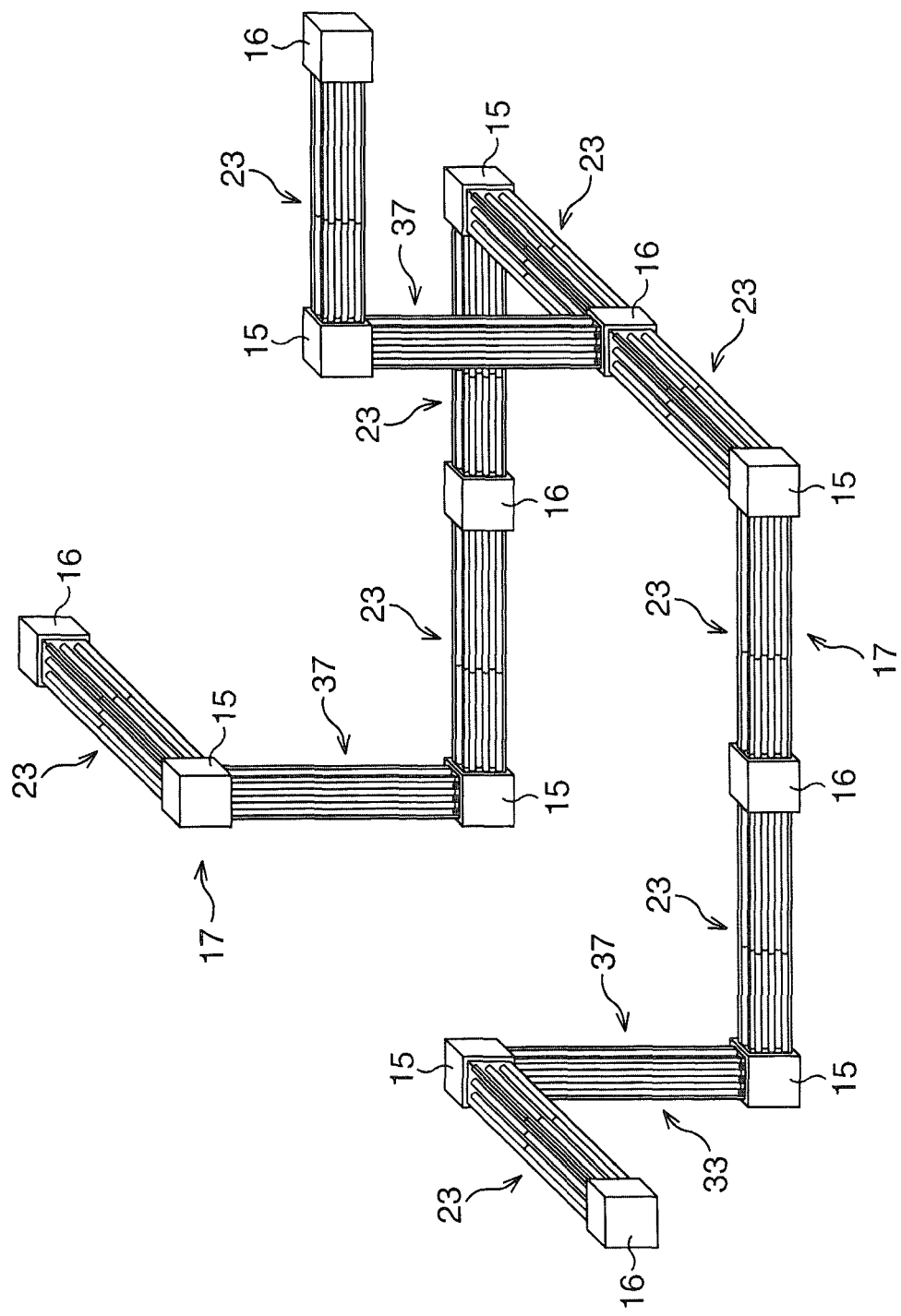
FIG. 8 is a schematic perspective view showing a completed wiring structure in the second embodiment.

By performing the above processes, the wiring structure being the three-dimensional wiring network structure as shown in FIG. 8 is completed.

Note that the present embodiment describes a case as an example where the wiring layers are stacked in two layers with one layer of the via layer interposed therebetween, but, it is possible to form a multilayer wiring structure by stacking a larger number of the wiring layers.

According to the present embodiment, it enables to form the wiring 23 made of the composite material composed of the CNT bundle 21 and the metal material 22 using the contact blocks 15 and 16 easily and securely at a low cost by reducing the number of processes as much as possible, and further by avoiding an adverse impact on the environment, and to realize the three-dimensional wiring network structure composed of the wirings using the CNTs as the material.

-Modified Example-

Here, a modified example of the second embodiment will be explained. The present example forms a wiring structure similar to the first embodiment, but, it differs from the first embodiment in the ultimate form of the wiring network structure. Note that the same reference numerals and symbols are used to designate the same constituent elements explained in the second embodiment.

Figure 9:
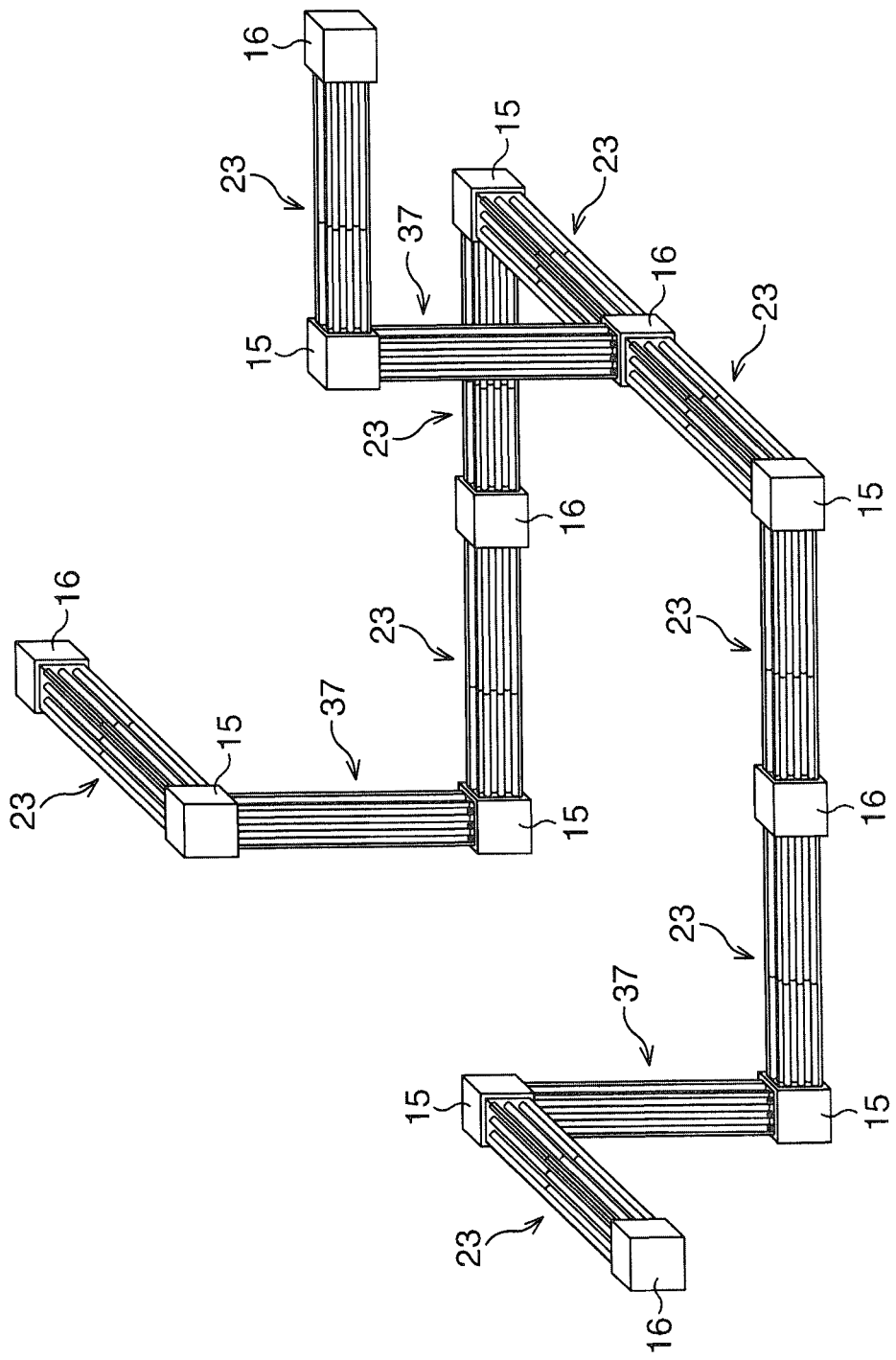
FIG. 9 is a schematic perspective view showing a completed wiring structure in a modified example of the second embodiment.

FIG. 9 is a schematic perspective view showing a wiring structure according to the modified example of the second embodiment. Note that, for the sake of illustration, the illustration of hierarchical portions of and under the interlayer insulating film 12 is omitted in FIG. 9.

In the present example, the interlayer insulating film 12 is formed of a material which is not dissolved at a later-described wet etching, such as, for instance, silicon nitride (SiN), instead of the silicon oxide film.

Subsequently, after conducting the processes performed in the second embodiment shown in FIG. 4C, FIG. 7 and FIG. 8, the interlayer insulating films 17 of the first and second wiring layers 101 and 103, and the interlayer insulating film 33 of the via layer 102, both of the interlayer insulating films 17 and 33 being made of the silicon oxide films, are dissolved to be removed by the wet etching, using, for example, hydrofluoric acid etching solution.

As a result, a three-dimensional wiring network structure composed only of, so to say, wiring skeletal structures of the contact blocks 15 and 16, the wirings 23 and the via portions 37 is completed, as shown in FIG. 9.

Since the CNTs have a quite strong mechanical strength, differed from the copper (Cu) wirings, it is possible to resist an external impact and so forth even without having the interlayer insulating films which support the wirings, as a case of the wiring network structure of the present embodiment. Therefore, according to the present embodiment, it enables to realize a quite light-weight three-dimensional wiring network structure in addition to obtain the various effects of the above-described second embodiment, with easy manufacturing processes.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A method of forming a wiring structure comprising:
   forming a pair of base conductors placed at an interval and facing each other above a substrate;
   forming an insulating film formed over each of upper surfaces of the pair of base conductors while a part of surfaces including each of opposing surfaces of the pair of base conductors is exposed;
   disposing catalyst materials for a wiring selectively on the part of surfaces exposed at the insulating film, using an electroless plating method over the substrate entirely including the insulating film; and
   forming the wiring including a first wiring made of a carbon element, a second wiring made of the carbon element, and a third wiring made of the carbon element,
   wherein the first wiring is electrically coupled to one of the pair of base conductors, linearly extends from the one of the pair of base conductors to the other of the pair of base conductors, and has a first portion which does not contact with the other of the pair of base conductors;
   wherein the second wiring is electrically coupled to the other of the pair of base conductors, linearly extends from the other of the pair of base conductors to the one of the pair of base conductors, and has a second portion which does not contact with the one of the pair of base conductors;
   wherein the third wiring is electrically coupled to the one of the pair of base conductors, linearly extends from the one of the pair of base conductors to the other of the pair of base conductors, and has a third portion which does not contact with the other of the pair of base conductors;
   wherein the first portion and a first surface of the second portion are intersected and contacted with each other to electrically coupled to each other, and a second surface of the second portion and the third portion are intersected and contacted with each other to electrically coupled to each other;
   wherein the method comprises:
   forming a metal buried in a portion between a first remaining portion other than the first portion of the first wiring and a third remaining portion other than the third portion of the third wiring.

2. The method of forming the wiring structure according to claim 1,
   wherein the wiring is carbon nano tubes or carbon nano fibers.

3. The method of forming the wiring structure according to claim 1,
   wherein the base conductors are made of at least one element selected from the group consisting of titanium (Ti), titanium nitride (TiN), tungsten (W), molybdenum (Mo) and silver (Ag), or made of an alloy containing at least one element selected from the group.

4. The method of forming the wiring structure according to claim 1,
   wherein the metal is made of at least one element selected from the group consisting of copper (Cu), titanium (Ti), titanium nitride (TiN), tungsten (W), molybdenum (Mo) and silver (Ag), or made of an alloy containing at least one element selected from the group.

5. The method of forming the wiring structure according to claim 1,
   wherein one or a plurality of said pair of the base conductors are horizontally arranged and the wiring is formed in a lateral direction with respect to a horizontal plane to construct a layer structure.

6. The method of forming the wiring structure according to claim 5,
   wherein the layer structure is stacked in a plurality of layers with via portions interposed therebetween to electrically connect said upper and lower base conductors to form a three-dimensional wiring network structure.

7. The method of forming the wiring structure according to claim 6,
   wherein the via portions are made of the wiring.

8. The method of forming the wiring structure according to claim 7,
   wherein a buried insulating film is formed to bury at least a part of the base conductors and the wiring when forming the respective layer structures;
   wherein an interlayer insulating film is formed to bury between the layer structures when forming the via portions; and
   wherein the buried insulating film and the interlayer insulating film are removed after forming the respective layer structures and the via portions.

* * * * *